US005249134A

United States Patent [19]
Oka

[11] Patent Number: 5,249,134
[45] Date of Patent: Sep. 28, 1993

[54] METHOD OF LAYOUT PROCESSING INCLUDING LAYOUT DATA VERIFICATION

[75] Inventor: Akihisa Oka, Osaka, Japan

[73] Assignee: Matsushita Electric Industrial Co., Ltd., Osaka, Japan

[21] Appl. No.: 810,353

[22] Filed: Dec. 18, 1991

Related U.S. Application Data

[63] Continuation of Ser. No. 335,407, Apr. 10, 1989, abandoned.

[30] Foreign Application Priority Data

Apr. 12, 1988 [JP] Japan .................................. 63-89820

[51] Int. Cl.⁵ ............................................. G06F 15/60
[52] U.S. Cl. ..................................... 364/491; 364/490; 364/489; 364/488
[58] Field of Search ............... 364/488, 489, 490, 491, 364/578; 371/23

[56] References Cited

U.S. PATENT DOCUMENTS

| 4,600,995 | 7/1986 | Kinoshita | 364/491 |
| 4,613,940 | 9/1986 | Shenton et al. | 364/490 |
| 4,630,219 | 12/1986 | DiGiacomo et al. | 364/488 |
| 4,635,208 | 1/1987 | Coleby et al. | 364/491 |
| 4,829,446 | 5/1989 | Draney | 364/488 |
| 4,910,680 | 3/1990 | Hiwatashi | 364/491 |

OTHER PUBLICATIONS

"A Block Interconnection Algorithm for Hierarchical Layout System", by M. Fukui et al., IEEE Trans. on Computer-Aided Design, vol. CAD-6, No. 3, May 1987, pp. 383-390.
"An Integrated Computer Aided Design System for Gate Array Masterslices: Part 2 The Layout Design System MARS-M3" by C. Tanaka et al., IEEE 18th Design Automation Conference, 1981, pp. 812-819.
"EXCL: A Circuit Extractor for IC Designs" by McCormick, IEEE 21st Design Automatiion Conf., 1984, pp. 616-623.
"A Block Interconnection Algorithm for Hierarchical Layout System" by Fukui et al., IEEE Trans. on Computer-Aided-Design, vol. CAD-6, No. 3, May 1987, pp. 383-390.
"Principles of CMOS VLSI Design"; Addison-Wesley Publishing Company pp. 99-102 and p. 258.
J. Mavor et al.–Introduction to MOS LSI Design, Chapter 3 "MOS Processing and Design Rules", Addison-Wesley Publishing Company, pp. 62-79, 1983.

Primary Examiner—Vincent N. Trans
Attorney, Agent, or Firm—Lowe, Price, LeBlanc & Becker

[57] ABSTRACT

A method of processing layout data of an integrated circuit including several circuit blocks and inter-block routing among the circuit blocks on data verification. The method includes the steps of processing layout data within at least one of the circuit blocks and replacing the layout data within that circuit block with layout data in a peripheral neighborhood region of that circuit block to process the replaced layout data.

15 Claims, 5 Drawing Sheets

METHOD OF LAYOUT PROCESSING INCLUDING LAYOUT DATA VERIFICATION

This application is a continuation of U.S. application Ser. No. 07/335,407 filed Apr. 10, 1989, now abandoned.

BACKGROUND OF THE INVENTION

The present invention relates generally to a method of layout processing including layout data verification for integrated circuits.

For design of integrated circuits, generally effected is a layout data processing such as format transformation, OR processing and AND processing. Also included in the layout data processing is a data verification processing such as a design rule check (see Neil Weste, Kawran Eshraghian, "Principles of CMOS VLSI Design", ADDISON-WESLEY PUBLISHING COMPANY pp. 99–102, pp. 258) and an electrical rule check which is employed generally for integrated circuits each comprising a plurality of circuit blocks and inter-block routings (or wiring). One known approach is to perform at once the data verification for the entire layout data of an integrated circuit which consists of all block layout data and inter-block routing layout data. One problem with such a data verification processing is, however, that in application to highly integrated circuits the required memory capacity becomes extremely large. One possible solution is to individually verify the block layout data and the inter-block routing layout data. However, such an approach makes it difficult to perform data verification for boundary portions between the blocks and the inter-block routings.

SUMMARY OF THE INVENTION

It is therefore an object of the present invention to provide a method of verifying the layout data of a highly integrated circuit without requiring a large memory capacity while allowing data verification of boundary portions between circuit blocks and inter-block routings.

With this and other objects which will become apparent as the description proceeds, a method according to the present invention broadly provides, upon performing layout data verification, an improved processing sequence for layout data of an integrated circuit comprising a plurality of circuit blocks and inter-block routing between the plurality of circuit blocks. The method comprises the steps of processing layout data for at least one of the plurality of circuit blocks and replacing the layout data for that circuit block by layout data for a peripheral neighborhood region of the circuit block to process the replaced layout data. Alternatively, the invention provides for processing layout data for the plurality of circuit blocks; and then replacing the layout data for at least one of the plurality of circuit blocks by layout data for a peripheral neighborhood region of the circuit block to process the replaced layout data.

BRIEF DESCRIPTION OF THE DRAWINGS

The present invention will be described in further detail with reference to the accompanying drawings, in which.

DETAILED DESCRIPTION OF THE INVENTION

Figure 1A:
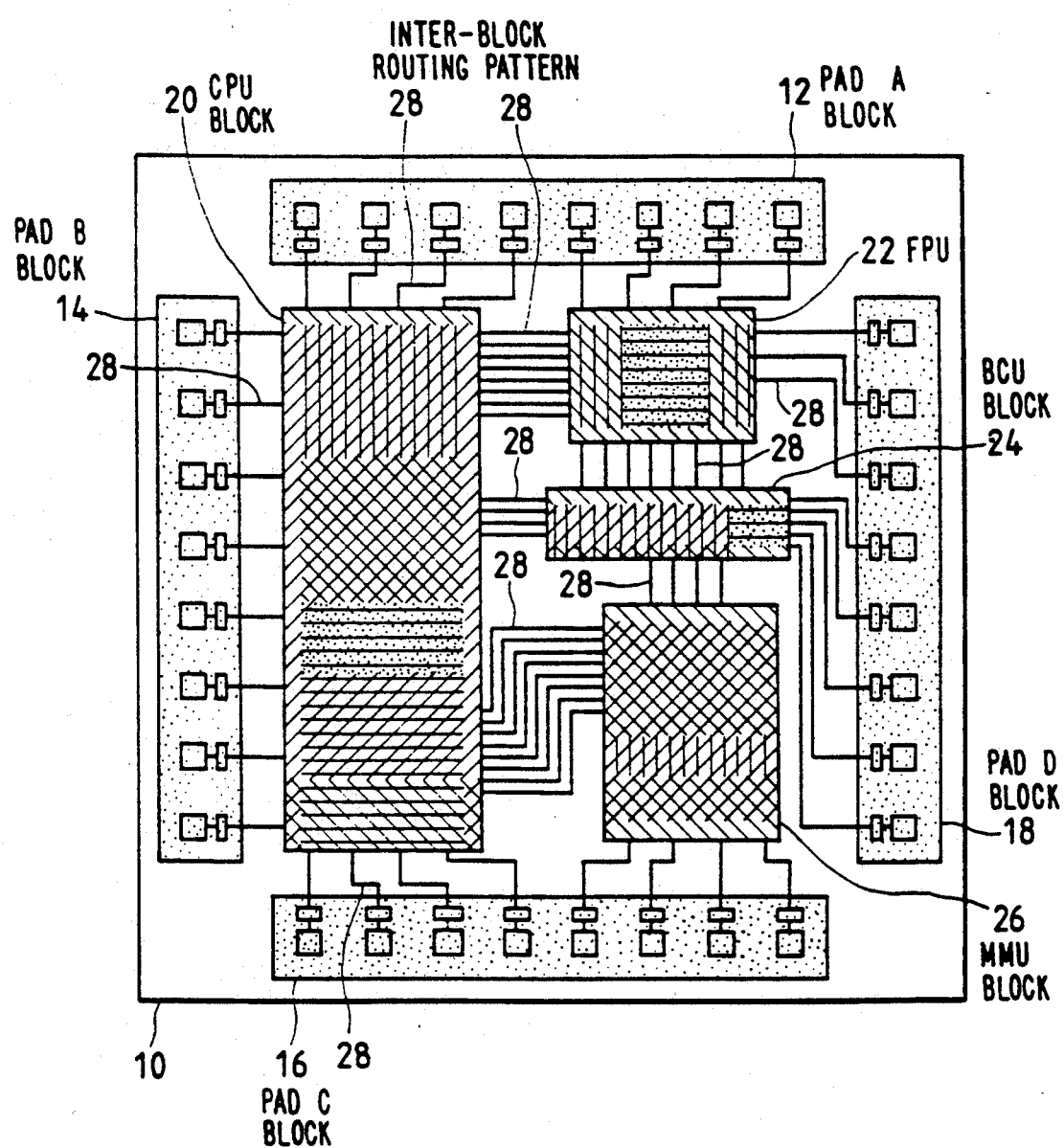
FIG. 1A shows the entire layout data of the microprocessor to be verified.
Figure 1B:
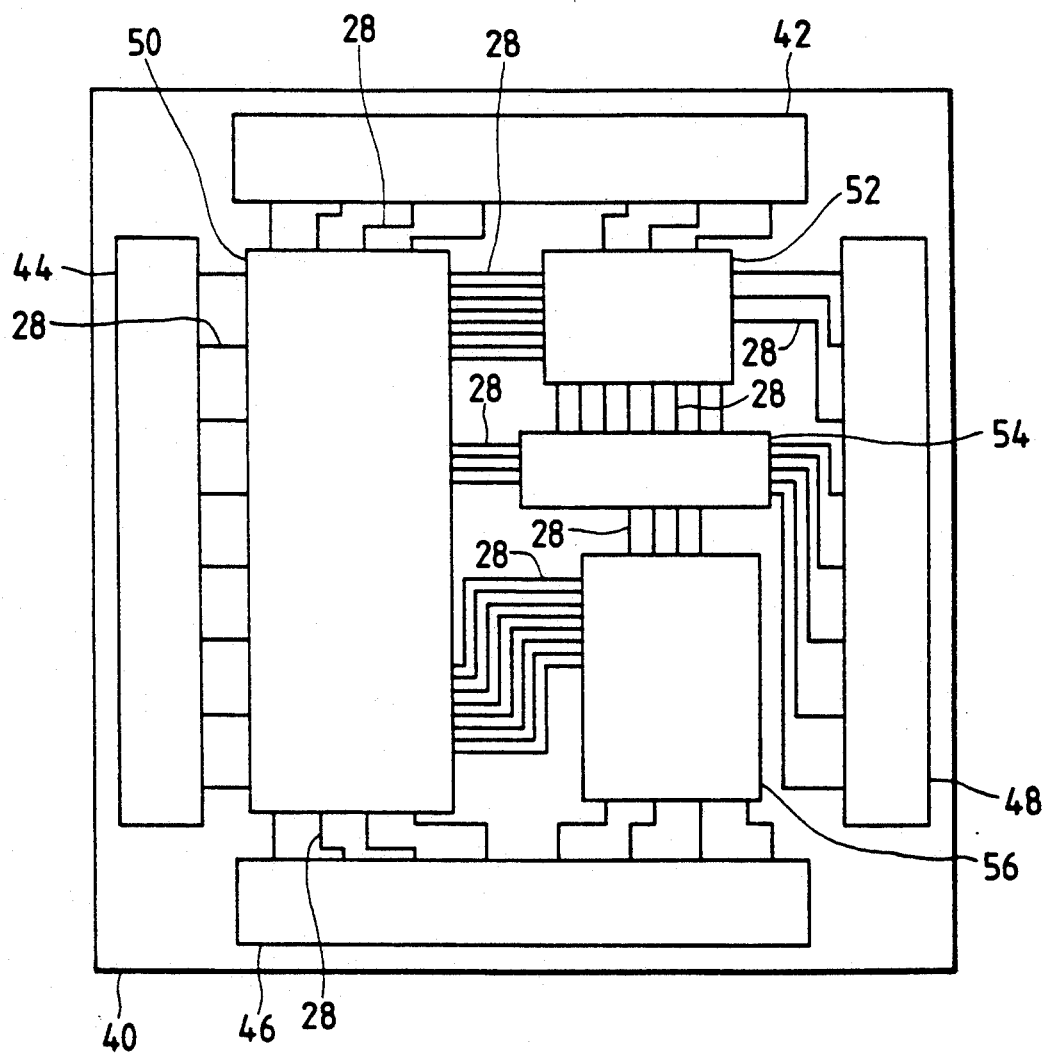
FIG. 1B illustrates the frame data of the entire layout data after frame-cut.
Figure 1C:
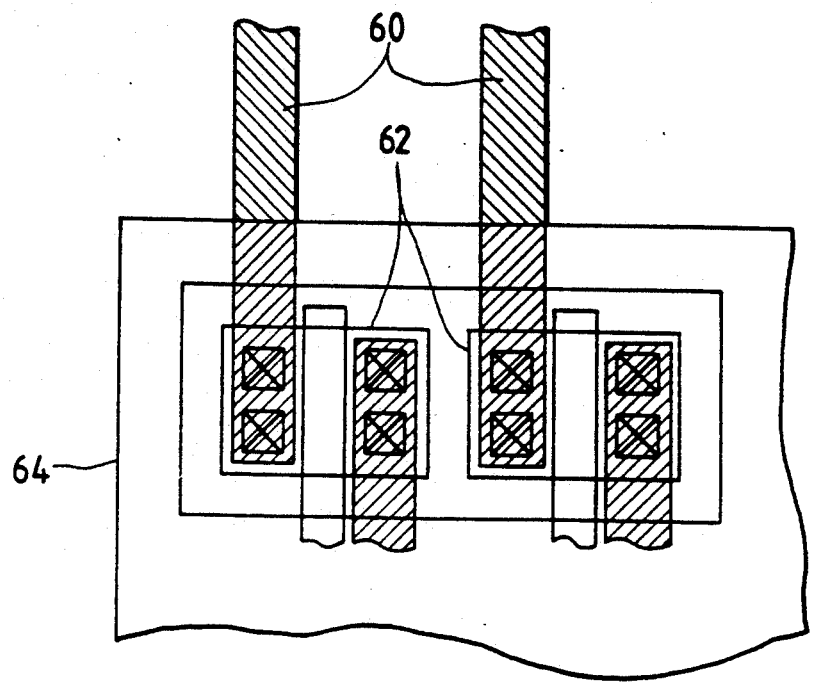
FIG. 1C is an enlarged illustration of a peripheral neighborhood of one block.
Figure 1D:
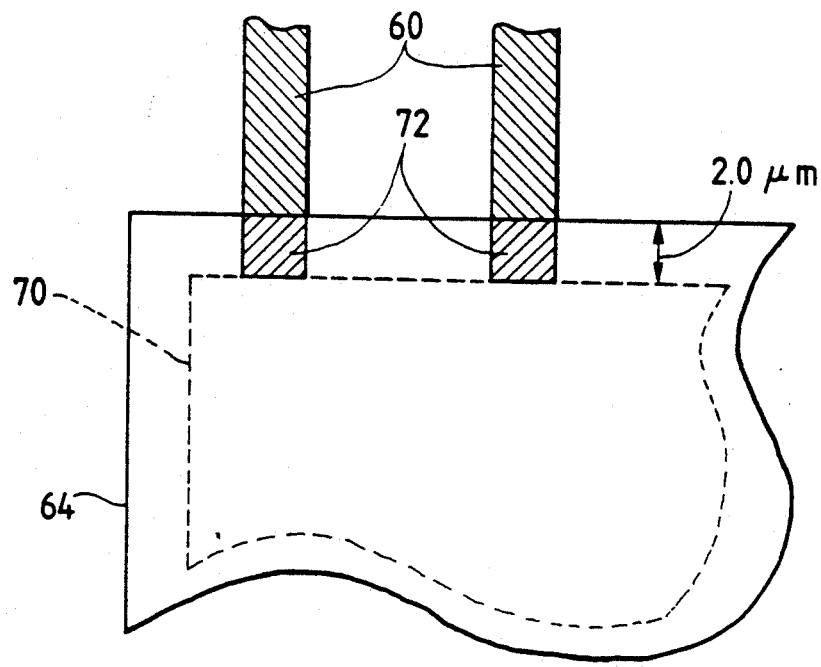
FIG. 1D is an enlarged illustration of the FIG. 1C block peripheral neighborhood after frame-cut.

FIGS. 1A to 1D are illustrations of a layout of a microprocessor for describing a verification method according to an embodiment of the present invention. Here, verification means a design error detection (including a minimum-width error detection) for the layout data on the basis of a predetermined design rule and an electrical short detection therefor. FIG. 1A shows the entire layout data of the microprocessor to be verified, designated at numeral 10. The entire layout data 10 comprises a pad A block 12, a pad B block 14, a pad C block 16, a pad D block 18, a CPU (central processing unit) block 20, a FPU (floating-point arithmatic unit) block 22, a BCU (bus control unit) block 24, a MMU (memory management unit) block 26, and an inter-block routing pattern 28. FIG. 1B illustrates the frame data of the entire layout data 10 after the frame-cut of the pad A block 12, pad B block 14, pad C block 16, pad D block 18, CPU block 20, FPU block 22, BCU block 24 and MMU block 26. The layout data comprises blocks 42, 44, 46, 48, 50, 52, 54 and 56 respectively corresponding to the blocks 12 to 26 and each of them is made smaller by a portion corresponding to the minimum routing (line) width, i.e., 2.0 micrometers, as compared with each of the respective blocks 12 to 26 of the layout data 10. FIG. 1C is an enlarged illustration of a peripheral neighborhood of one block and FIG. 1D is an enlarged illustration of the FIG. 1C block peripheral neighborhood after frame-cut.

A description will initially be given hereinbelow in terms of the frame-cut with reference to FIGS. 1C and 1D. A block peripheral pattern 64 illustrated in FIG. 1C is shrunk by the minimum routing width (2.0 micrometers) so as to form a 2.0 micrometer-shrunk block peripheral pattern 70 illustrated in FIG. 1D. Designated at numeral 62 is an intra-block routing pattern, from which the pattern 70 is taken off so as to form an intra-block routing pattern 72 positioned in a peripheral neighborhood region having a width equal to the minimum routing width of 2.0 micrometers. This series of processes is referred to as the frame-cut processing. In FIG. 1C, numeral 60 represents an inter-block routing pattern.

Secondly, a description will be made hereinbelow in terms of the design rule check for the entire layout data 10 of the microprocessor shown in FIG. 1A. The design rule check is initially effected for the the pad A block 12, pad B block 14, pad C block 16, pad D block 18, CPU block 20, FPU block 22, BCU block 24 and MMU block 26. After termination of the design rule check for the respective blocks 12 to 26, the above-mentioned frame-cut processing is performed for the blocks 12 to 26 of the entire layout data 10 to produce the frame-cut pad A block 42, frame-cut pad B block 44, frame-cut pad C block 46, frame-cut pad D block 48, frame-cut CPU block 50, frame-cut FPU block 52, frame-cut BCU block 54 and frame-cut MMU block 56 as shown in FIG. 1B. Thereafter, in the entire data 10 of the microprocessor, the pad A block 12, pad B block 14, pad C block 16, pad D block 18, CPU block 20, FPU block 22, BCU block 24 and MMU block 26 are respectively replaced or substituted with the frame-cut pad A block 42, frame-cut pad B block 44, frame-cut pad C block 46, frame-cut pad D block 48, frame-cut CPU block 50, frame-cut FPU block 52, frame-cut BCU block 54 and frame-cut MMU block 56, thereby producing the layout data 40 of the microprocessor comprising the respective frame-cut blocks 42 to 56 and the inter-block routing pattern 28. The design rule check is again executed for this microprocessor layout data 40.

Figure 1E:
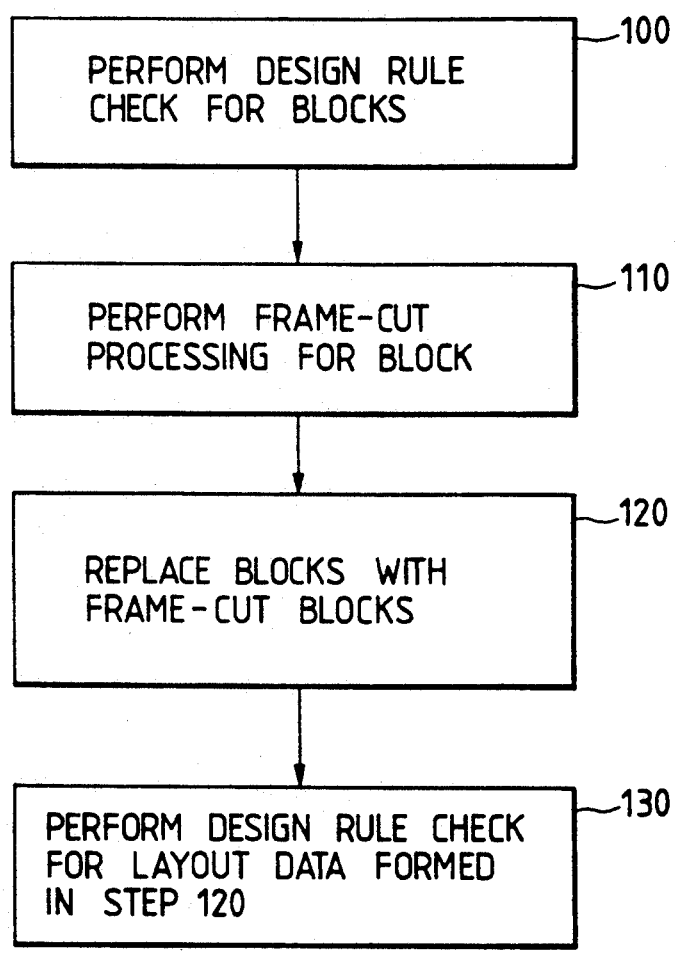
FIG. 1E is a flow chart for describing the layout data processing of this embodiment.
Figure 1F:
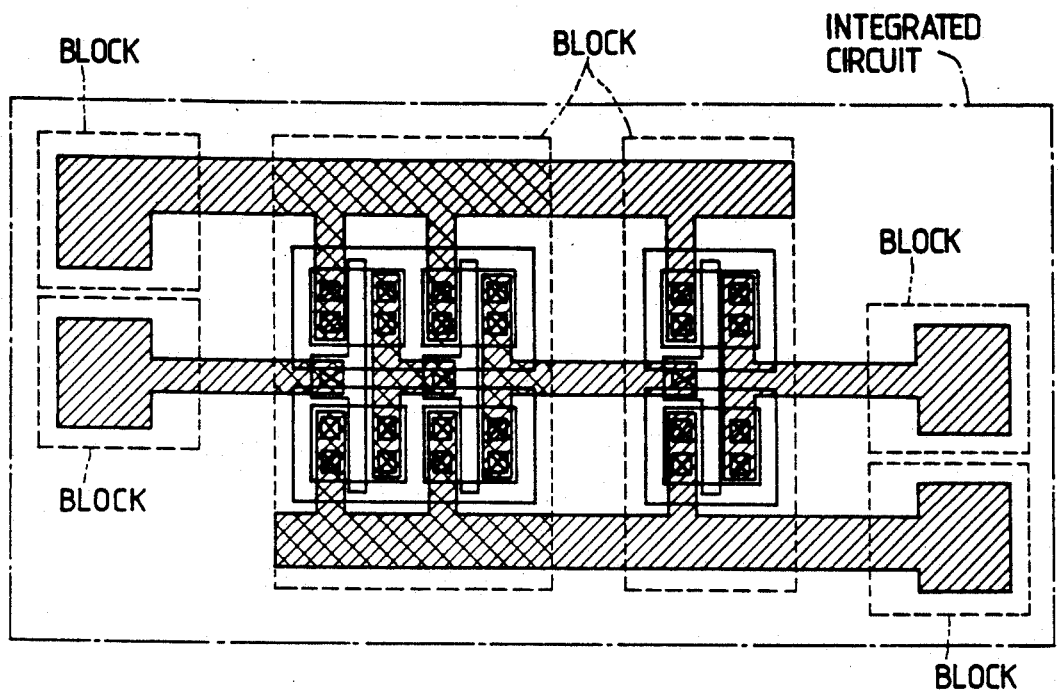
FIGS. 1F and 1G are illustrations for a better understanding of a frame-cut processing and replacement processing effected in this embodiment.
Figure 1G:
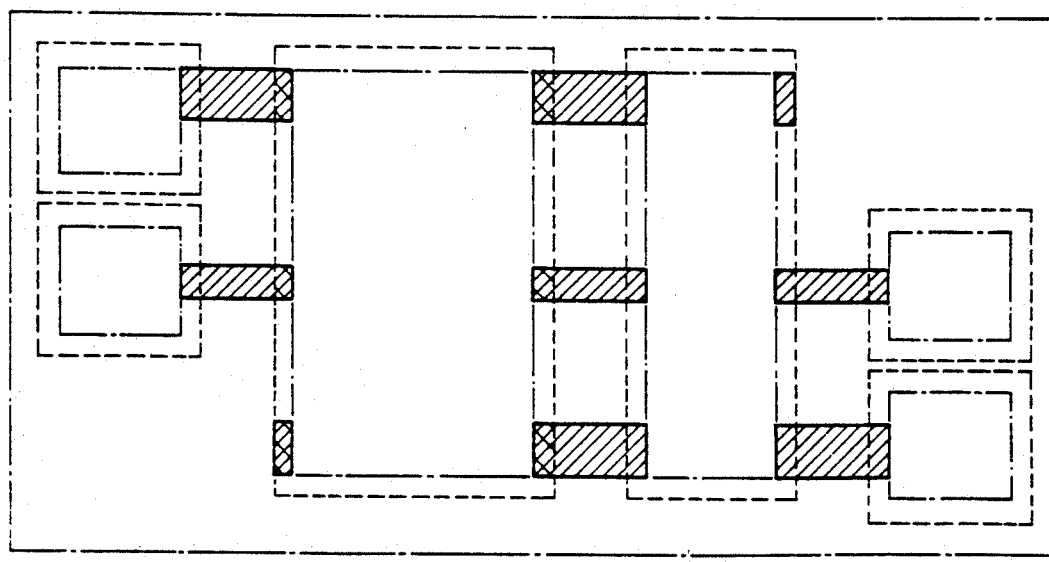

For a better understanding of this embodiment of the invention, a further description will be hereinbelow with reference to FIGS. 1E to 1G. FIG. 1E is a flow chart entirely showing the layout data processing of this embodiment. After execution of the design rule check for each block of the layout data 10 in a step 100, the frame-cut processing is carried out for each of the blocks 12 to 26 in a step 110. After the frame-cut of the respective blocks 12 to 26 to form the frame-cut blocks 44 to 56, the respective blocks 12 to 26 are replaced with the frame-cut blocks 44 to 56 in a step 120 so as to form frame data (frame-cut integrated circuit pattern) corresponding to the layout data in the peripheral neighborhood regions of the respective blocks 12 to 26. That is, with reference to FIG. 1F showing the layout data of an integrated circuit including a plurality of blocks (illustrated by dotted lines) and inter-block and intra-block routings (illustrated by shadow portions), each of the blocks is shrunk by 2.0 micrometers in the frame-cut processing and the data for the shrunk blocks are removed from the layout data of FIG. 1F, that is, the respective original blocks are replaced with the frame-cut blocks. As a result, an integrated circuit pattern (inter-block routing pattern) can be obtained as shown in FIG. 1G in which alternate long and short dash lines represents the shrunken blocks. After the replacement, the design rule check is, in a step 130, further performed for the layout data illustrated in FIG. 1G.

In the layout processing method of this invention, since as described above each of the respective intra-block layout data is processed with substitution to the intra-block peripheral neighborhood region layout data, the data amount can be reduced to be only 1/10 of that of the conventional layout processing. In addition, since the layout processing is arranged to be performed for both the inter-block routing pattern and intra-block peripheral neighborhood region routing pattern, it is possible to effect the layout data verification of boundary portions between the inter-block routing pattern and the intra-block routing pattern.

It should be understood that the foregoing relates to only a preferred embodiment of the present invention, and that it is intended to cover all changes and modifications of the embodiment of this invention herein used for the purposes of the disclosure, which do not constitute departures from the spirit and scope of the invention. For example, although in this embodiment the design rule check is performed for the respective blocks of the entire layout data of the microprocessor before performing the design rule check for the entire layout data after substitution with the frame-cut blocks, it is also appropriate that the design rule check is performed for at least one block before performing the entire layout data in which the block is substituted with the frame-cut block.

What is claimed is:

1. A computer implemented method requiring reduced data storage capacity for processing layout data of an integrated circuit, the circuit including a plurality of circuit blocks and inter-block routing among said plurality of circuit blocks, comprising the steps of:
   using a computer to perform a design rule check for layout data for at least one but not all of said plurality of circuit blocks;
   using a computer to replace the layout data for said at least one circuit block by replacement internal routing layout data for a peripheral neighborhood region of said at least one circuit block; and
   using a computer to process said inter-block routing and said replacement internal routing layout data by performing said design rule check thereon, whereby a smaller amount of memory is required in the computer than required for performing the design rule check for layout data for all of said plurality of circuit blocks.

2. A computer implemented method of processing layout data as claimed in claim 1, wherein said step of using a computer to process said inter-block routing and said replacement internal routing layout data comprises using the computer to perform a layout design rule check for said inter-block routing data and for said replacement internal routing layout data, thereby reducing an amount of memory required for the layout design rule check for the integrated circuit.

3. A computer implemented method of processing layout data as claimed in claim 1, comprising the further step of performing a frame-cut operation after said step of using the computer to perform a design rule check for the layout data of said at least one of said plurality of circuit blocks, and
   wherein said step of using the computer to replace the layout data for said at least one circuit block by replacement internal routing layout data for a peripheral neighborhood region comprises replacing the layout data for said at least one circuit block by frame data corresponding to the layout data in peripheral regions within a minimum line-width of a periphery of said at least one circuit block.

4. A computer implemented method of processing layout data as claimed in claim 3, wherein said step of using a computer to process said inter-block routing and said replacement internal routing layout data comprises using the computer to perform a layout design rule check for said inter-block routing data and for said replacement internal routing layout data, thereby reducing an amount of memory required for the layout design rule check for the integrated circuit.

5. A computer implemented method of processing layout data as claimed in claim 1, wherein said replacement internal routing layout data for the peripheral neighborhood region is data within a minimum line width from said inter-block routing.

6. A computer implemented method of processing layout data as claimed in claim 1, comprising the further steps of:
   using a computer to perform a design rule check for layout data for another of said plurality of circuit blocks;
   using a computer to replace the layout data for said another circuit block by replacement internal routing layout data for a peripheral neighborhood region of said another circuit block; and using a computer to process said inter-block routing and said replacement internal routing layout data for said another circuit block.

7. A computer implemented method requiring reduced data storage capacity for processing layout data of an integrated circuit, the circuit including a plurality of circuit blocks and inter-block routing among said plurality of circuit blocks, comprising the steps of:

using a computer to perform a design rule check for layout data for said plurality of circuit blocks; then using a computer to replace the layout data for at least one of said plurality of circuit blocks by replacement internal routing layout data for only a peripheral neighborhood region of said at least one circuit block; and using a computer to process said inter-block routing and said replacement internal routing layout data, whereby a smaller amount of memory is required in the computer than required for performing the design rule check for layout data for all of said plurality of circuit blocks and said inter-block routing.

8. A computer implemented method of processing layout data as claimed in claim 7, wherein said step of using a computer to process said inter-block routing and said replacement internal routing layout data comprises using the computer to perform a layout design rule check for said inter-block routing data and for said replacement internal routing layout data, thereby reducing an amount of memory required for the layout design rule check for the integrated circuit.

9. A computer implemented method of processing layout data as claimed in claim 7, comprising the further step of performing a frame-cut operation after said step of using the computer to perform a design rule check for the layout data for said plurality of circuit blocks, and wherein said step of using the computer to replace the layout data for said at least one circuit block by replacement internal routing layout data for a peripheral neighborhood region comprises replacing the layout data for said at least one circuit block by frame data corresponding to the layout data in peripheral neighborhood regions of said at least one circuit block.

10. A computer implemented method of processing layout data as claimed in claim 9, wherein said step of using a computer to process said inter-block routing and said replacement internal routing layout data comprises using the computer to perform a layout design rule check for said inter-block routing data and for said replacement internal routing layout data, thereby reducing an amount of memory required for the layout design rule check for the integrated circuit.

11. A computer implemented method of processing layout data as claimed in claim 7, wherein said replacement internal routing layout data for the peripheral neighborhood region is data within a minimum line width from said inter-block routing.

12. A computer implemented method of processing layout data as claimed in claim 7, comprising the further steps of:

using a computer to replace the layout data for another of said plurality of circuit blocks by replacement internal routing layout data for a peripheral neighborhood region of said another circuit block; and using a computer to process said inter-block routing and said replacement internal routing layout data for said another circuit block.

13. A computer implemented method requiring reduced data storage capacity for layout design rule check of an integrated circuit, said circuit including a plurality of circuit blocks and inter-block routing among said plurality of circuit blocks, comprising the steps of:

using a computer to perform a layout design rule check for layout data for at least one but not all of said plurality of circuit blocks;

using a computer to replace the layout data for said at least one circuit block by replacement internal routing layout data for a peripheral neighborhood region of said at least one circuit block within a minimum line width from said inter-block routing; and using a computer to perform the layout design rule check for said inter-block routing and said replacement internal routing layout data, thereby reducing an amount of memory required for performing the layout design rule check for all of said circuit blocks of the integrated circuit and the inter-block routing.

14. A computer implemented method of processing layout data as claimed in claim 13, comprising the further step of performing a frame-cut operation after said step of using the computer to perform a layout design rule check for the layout data for said at least one of said plurality of circuit blocks, and wherein said step of using the computer to replace the layout data for said at least one circuit block by replacement internal routing layout data for a peripheral neighborhood region comprises replacing the layout data for said at least one circuit block by frame data corresponding to the layout data in peripheral neighborhood regions of said at least one circuit block.

15. A computer implemented method of processing layout data as claimed in claim 13, comprising the further steps of:

using a computer to perform a layout design rule check for layout data for another of said plurality of circuit blocks;

using a computer to replace the layout data for said another circuit block by replacement internal routing layout data for a peripheral neighborhood region of said another circuit block within a minimum line width of said inter-block routing from a periphery of said another circuit block; and using a computer to perform a layout design rule check for said inter-block routing and said replacement internal routing layout data of said another circuit block.

* * * * *